United States Patent
Koba

(10) Patent No.: US 11,046,051 B2
(45) Date of Patent: Jun. 29, 2021

(54) METAL-ON-CERAMIC SUBSTRATES

(71) Applicant: Materion Corporation, Mayfield Heights, OH (US)

(72) Inventor: Richard J. Koba, Saugus, MA (US)

(73) Assignee: Materion Corporation, Mayfield Heights, OH (US)

( * ) Notice: Subject to any disclaimer, the term of this patent is extended or adjusted under 35 U.S.C. 154(b) by 0 days.

(21) Appl. No.: 15/364,821

(22) Filed: Nov. 30, 2016

(65) Prior Publication Data

US 2017/0151755 A1    Jun. 1, 2017

Related U.S. Application Data

(60) Provisional application No. 62/261,424, filed on Dec. 1, 2015.

(51) Int. Cl.
*B32B 15/08* (2006.01)
*B32B 7/12* (2006.01)
(Continued)

(52) U.S. Cl.
CPC .......... *B32B 7/12* (2013.01); *B32B 7/02* (2013.01); *B32B 9/005* (2013.01); *B32B 9/041* (2013.01); *B32B 15/04* (2013.01); *B32B 15/043* (2013.01); *B32B 15/18* (2013.01); *B32B 15/20* (2013.01); *B32B 27/281* (2013.01); *B32B 37/12* (2013.01); *B32B 37/144* (2013.01); *C04B 35/6269* (2013.01); *C04B 35/645* (2013.01); *C04B 37/008* (2013.01); *C04B 37/025* (2013.01); *C04B 37/026* (2013.01); *C04B 37/028* (2013.01); *C09J 179/085* (2013.01); *C25D 5/12* (2013.01); *F28F 21/04* (2013.01); *F28F 21/067* (2013.01); *F28F 21/081* (2013.01);
(Continued)

(58) Field of Classification Search
None
See application file for complete search history.

(56) References Cited

U.S. PATENT DOCUMENTS 4,670,325 A * 6/1987 Bakos ............... H01L 23/49883
174/258
5,061,549 A * 10/1991 Shores ........................ C09J 7/00
156/60

(Continued)

FOREIGN PATENT DOCUMENTS

EP    2048209    *  4/2009  ............... C09J 4/00
JP    S62 187034 A    8/1987
(Continued)

OTHER PUBLICATIONS

International Search Report and Written Opinion for International Application No. PCT/US2016/064153 dated Feb. 22, 2017.

*Primary Examiner* — Seth Dumbris
(74) *Attorney, Agent, or Firm* — Cozen O'Connor

(57) ABSTRACT

A metal-on-ceramic substrate comprises a ceramic layer, a first metal layer, and a bonding layer joining the ceramic layer to the first metal layer. The bonding layer includes thermoplastic polyimide adhesive that contains thermally conductive particles. This permits the substrate to withstand most common die attach operations, reduces residual stress in the substrate, and simplifies manufacturing processes.

20 Claims, 5 Drawing Sheets

(51) Int. Cl.

| | | |
|---|---|---|
| *B32B 27/28* | (2006.01) | |
| *C09J 179/08* | (2006.01) | |
| *H05K 3/38* | (2006.01) | |
| *B32B 37/14* | (2006.01) | |
| *C04B 35/645* | (2006.01) | |
| *C04B 37/00* | (2006.01) | |
| *C04B 35/626* | (2006.01) | |
| *C04B 37/02* | (2006.01) | |
| *B32B 15/04* | (2006.01) | |
| *B32B 15/20* | (2006.01) | |
| *B32B 7/02* | (2019.01) | |
| *B32B 15/18* | (2006.01) | |
| *B32B 9/00* | (2006.01) | |
| *B32B 9/04* | (2006.01) | |
| *B32B 37/12* | (2006.01) | |
| *C25D 5/12* | (2006.01) | |
| *F28F 21/04* | (2006.01) | |
| *F28F 21/06* | (2006.01) | |
| *F28F 21/08* | (2006.01) | |
| *G03F 7/00* | (2006.01) | |
| *H01L 21/48* | (2006.01) | |
| *H01L 23/373* | (2006.01) | |
| *H05K 1/03* | (2006.01) | |
| *F28F 13/00* | (2006.01) | |

(52) U.S. Cl.
CPC ........ *G03F 7/0035* (2013.01); *H01L 21/4871* (2013.01); *H01L 23/3735* (2013.01); *H05K 3/386* (2013.01); *B32B 2250/03* (2013.01); *B32B 2250/40* (2013.01); *B32B 2255/06* (2013.01); *B32B 2255/205* (2013.01); *B32B 2255/26* (2013.01); *B32B 2307/202* (2013.01); *B32B 2307/302* (2013.01); *B32B 2307/732* (2013.01); *B32B 2311/00* (2013.01); *B32B 2311/04* (2013.01); *B32B 2311/08* (2013.01); *B32B 2311/09* (2013.01); *B32B 2311/12* (2013.01); *B32B 2311/22* (2013.01); *B32B 2315/02* (2013.01); *B32B 2379/08* (2013.01); *B32B 2457/00* (2013.01); *B32B 2457/14* (2013.01); *C04B 2237/08* (2013.01); *C04B 2237/086* (2013.01); *C04B 2237/09* (2013.01); *C04B 2237/121* (2013.01); *C04B 2237/123* (2013.01); *C04B 2237/124* (2013.01); *C04B 2237/125* (2013.01); *C04B 2237/34* (2013.01); *C04B 2237/343* (2013.01); *C04B 2237/348* (2013.01); *C04B 2237/365* (2013.01); *C04B 2237/366* (2013.01); *C04B 2237/368* (2013.01); *C04B 2237/402* (2013.01); *C04B 2237/405* (2013.01); *C04B 2237/406* (2013.01); *C04B 2237/407* (2013.01); *C04B 2237/408* (2013.01); *C04B 2237/55* (2013.01); *C04B 2237/56* (2013.01); *C04B 2237/704* (2013.01); *C04B 2237/706* (2013.01); *C04B 2237/708* (2013.01); *C04B 2237/72* (2013.01); *F28F 2013/001* (2013.01); *F28F 2275/025* (2013.01); *H05K 1/0306* (2013.01); *H05K 2201/026* (2013.01); *H05K 2201/0215* (2013.01); *Y10T 428/12569* (2015.01)

(56) References Cited

U.S. PATENT DOCUMENTS

| | | | | |
|---|---|---|---|---|
| 5,591,034 | A * | 1/1997 | Ameen | ............... H01L 23/3737 |
| | | | | 257/E23.107 |
| 5,686,191 | A | 11/1997 | Miwa et al. | |
| 7,691,475 | B2 * | 4/2010 | Larson | ................... C09J 179/08 |
| | | | | 428/355 BL |
| 2002/0124955 | A1 * | 9/2002 | Tung | ...................... B32B 37/12 |
| | | | | 156/300 |
| 2002/0139473 | A1 | 10/2002 | Jujii et al. | |
| 2004/0099374 | A1 * | 5/2004 | Kanakarajan | ........... B32B 15/08 |
| | | | | 156/345.1 |
| 2006/0124693 | A1 * | 6/2006 | Meloni | ....................... C08J 5/18 |
| | | | | 228/56.3 |
| 2007/0110969 | A1 * | 5/2007 | Suzuki | .................... B32B 15/08 |
| | | | | 428/209 |
| 2009/0056995 | A1 * | 3/2009 | Maeda | .................... B32B 15/08 |
| | | | | 174/259 |
| 2009/0252957 | A1 * | 10/2009 | Kasumi | .................. B32B 15/08 |
| | | | | 428/349 |
| 2011/0210407 | A1 * | 9/2011 | Katayama | .................. C09J 7/20 |
| | | | | 257/414 |
| 2011/0274888 | A1 * | 11/2011 | Tang | ........................ B82Y 30/00 |
| | | | | 428/189 |
| 2012/0107642 | A1 | 5/2012 | Meyer et al. | |
| 2012/0141753 | A1 * | 6/2012 | Hunrath | .................... B32B 7/12 |
| | | | | 428/212 |
| 2012/0295085 | A1 * | 11/2012 | Iida | ......................... B32B 27/34 |
| | | | | 428/212 |
| 2013/0245160 | A1 * | 9/2013 | Shimada | ................ C09J 183/10 |
| | | | | 523/457 |
| 2013/0288120 | A1 * | 10/2013 | Iida | ............................. C09J 7/35 |
| | | | | 429/211 |
| 2015/0057396 | A1 * | 2/2015 | Fraivillig | ............... B05D 3/108 |
| | | | | 524/104 |
| 2016/0059535 | A1 * | 3/2016 | Koba | ........................ B32B 7/12 |
| | | | | 156/306.9 |

FOREIGN PATENT DOCUMENTS

| | | |
|---|---|---|
| JP | H06 117544 A | 4/1994 |
| JP | 2000 143362 A | 5/2000 |
| WO | WO-2014054812 A1 * | 4/2014 |
| WO | WO 2016/033522 A1 | 3/2016 |

* cited by examiner

METAL-ON-CERAMIC SUBSTRATES

CROSS-REFERENCE TO RELATED APPLICATIONS

This application claims priority to U.S. Provisional Patent Application Ser. No. 62/261,424, filed on Dec. 1, 2015, the disclosure of which is hereby fully incorporated by reference herein.

BACKGROUND

The present disclosure relates to circuit fabrication. More particularly, the present disclosure involves the use of a particle-filled adhesive bonding layer which is thermally conductive in the production of a metal-on-ceramic substrate.

Metal-on-ceramic substrates are extensively used for production of electronic circuits. The metal layer can be shaped, e.g. photoetched, to form conductive paths, allowing for these substrates to replace traditional wired circuits. The metal is typically copper. The ceramic is typically alumina, beryllia (BeO), silicon nitride ($Si_3N_4$), or aluminum nitride (AlN). Of the four, AlN offers the highest thermal conductivity without the environmental health and safety (EH&S) concerns of BeO.

Conventional metal-on-AlN and metal-on-$Si_3N_4$ substrates have a number of limitations. One such limitation is the lack of a stable metal-ceramic bond phase. Presently, thick (8 to 16 mils thick) sheets of copper cannot be directly, chemically bonded to an AlN or $Si_3N_4$ ceramic substrate. There are thus two approaches in the industry to form a thick copper layer on an AlN ceramic substrate.

The first approach is known as direct bond copper (DBC). The surface of the AlN is oxidized to form a surface scale, viz. alumina on an aluminum nitride ceramic. An alumina-copper-oxide ($AlCu_xO_y$) then forms, which acts as a bond layer to both the alumina scale and the copper. The DBC process typically occurs at temperatures of around 1070° C.

The second approach is known as active metal braze (AMB) or vacuum brazing. The metal can be brazed to the ceramic using an active brazing alloy such as CuSil-ABA (commercially available from Morgan Advanced Materials, containing 63.0% silver, 34.25% copper, and 1.75% titanium) under vacuum. This process typically occurs at temperatures of around 825° C. Active metal brazing is routinely used to bond sheets of copper to AlN and $Si_3N_4$ substrates.

These approaches result in residual stress between the metal and the ceramic due to the severe coefficient of thermal expansion ("CTE") mismatch between the metal and the ceramic. For example, copper has a CTE of 17.9 ppm/° C., aluminum nitride (AlN) has a CTE of 4.4 ppm/° C., and $Si_3N_4$ has a CTE of 3.4 ppm/° C. The high CTE mismatch is another limitation of conventional metal-on-ceramic substrates. This CTE mismatch requires both faces of the ceramic to be coated with metal of equal thickness in order to balance the stress and minimize bowing or cracking of the ceramic. This need to have thick metal on both faces increases production costs. In addition, the bond layer between the metal and the AlN or $Si_3N_4$ ceramic usually has high thermal resistance. This reduces the ability of the ceramic to absorb and dissipate heat generated in the metal layer, or generated by semiconductor chips bonded to the metal layer.

A third approach is to pattern metallize a ceramic using a thin film process to create a "seed" layer, then up-plate the seed layer to a thick metal layer by an electrolytic or electroless process. This process exhibits the lowest thermal resistance between the metal and the ceramic and it produces thick layers with no stress from CTE mismatch, but this process suffers from high cost and limited gap widths between the metal traces imposed by the lateral growth of the metal during plating.

It would be desirable to provide processes for preparing metal-on-ceramic substrates that can avoid these problems, and desirably are of relatively lower cost and relatively simpler as well.

BRIEF DESCRIPTION

The present disclosure relates to fabrication of a metal-on-ceramic substrate involving a bonding layer between the metal and ceramic layers. This substrate can be used to form electrical circuits with appropriate processing.

Disclosed in various embodiments are circuit substrates formed from a first metal layer, a ceramic layer, and a bonding layer which comprises a thermally conductive adhesive. Also disclosed herein are processes for making the circuit substrate.

The bonding layer may comprise a foil layer and two adhesive layers on opposite sides of the foil layer.

In the present disclosure, the adhesive of the bonding layer may include (i) a polyimide or a thermoplastic polyimide (TPI), and (ii) thermally conductive particles. The thermally conductive particles can be a dielectric material. The thermally conductive particles may be selected from the group consisting of silver, gold, copper, graphene, carbon nanotubes, hexagonal BN, würtzitic BN, cubic BN, BN nanotubes, diamond, AlN and $Si_3N_4$.

The first metal layer may be a metal selected from the group consisting of copper, covetic copper, copper-beryllium, aluminum, aluminum silicon carbide (AlSiC), silver, palladium, platinum, nickel, gold, stainless steel, nickel-cobalt ferrous alloy, and alloys thereof. In particular embodiments, the first metal layer includes a set of sublayers. The first metal layer may have a thickness of from about 1 mil to about 30 mils.

The circuit substrate may, in some embodiments, further comprise a second metal layer on a side of the ceramic layer opposite the first metal layer.

The ceramic layer can be made of a ceramic selected from the group consisting of aluminum nitride (AlN), alumina ($Al_2O_3$), BeO, zirconia toughened alumina (ZTA), SiC, and $Si_3N_4$. The ceramic layer may have a thickness of about 20 mils to about 60 mils. The ceramic may also have a three dimensional shape, such as a finned heatsink, whose total thickness exceeds 60 mils (1.5 mm).

Also disclosed herein are processes for creating the circuit substrate described herein, comprising: placing the bonding layer between the ceramic layer and the first metal layer; applying pressure to bond the ceramic layer to the first metal layer using the bonding layer; and curing the bonding layer.

The first metal layer can be shaped into a desired shape prior to applying the pressure, or after curing the bonding layer.

In particular embodiments, the first metal layer is shaped by coating the first metal layer with photoresist, developing the photoresist to obtain a desired pattern, and removing the first metal layer with an acid in areas not covered by developed photoresist. The developed photoresist may then be stripped in an alkaline solution. Other methods may be used to remove the developed photoresist, including plasma etching or reactive ion etching.

A fixture or jig can be used to align the ceramic layer, the bonding layer, and the first metal layer.

The applied pressure may have a magnitude of from about 65 kPa to about 75 kPa. The curing can be performed by exposing the bonding layer to an elevated temperature of about 210° C. to about 290° C.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
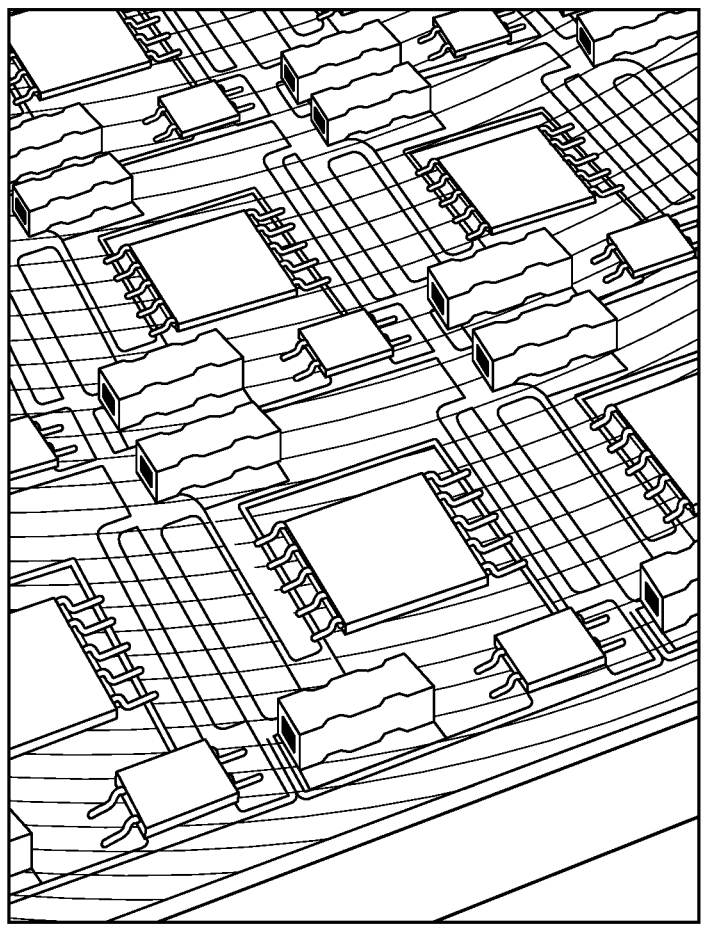
FIG. 1 is a picture of a circuit built on a direct bond copper substrate.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 to 10" is inclusive of the endpoints, 2 and 10, and all the intermediate values).

A value modified by a term or terms, such as "about" and "substantially," may not be limited to the precise value specified. The modifier "about" should also be considered as disclosing the range defined by the absolute values of the two endpoints. For example, the expression "from about 2 to about 4" also discloses the range "from 2 to 4."

As used herein, the term "coefficient of thermal expansion" or "CTE" refers to the linear coefficient of thermal expansion at 20° C.

A "mil" is one-thousandths of an inch.

FIG. 1 is a picture of a circuit built on a direct bond copper substrate. The copper layer has been etched to form conductive paths between various components that are attached to the alumina substrate.

The present disclosure relates to circuit substrates that are made from a metal layer, a bonding layer, and a ceramic layer. The bonding layer includes an adhesive mixed with thermally conductive particles. The bonding layer can be cured at temperatures of less than 300° C., which is much lower than other prior art processes. However, after curing, the substrate can withstand extended operation at temperatures higher than the curing temperature. The resulting substrate also has reduced thermal stress, and the manufacturing process is lower in cost.

Figure 2:
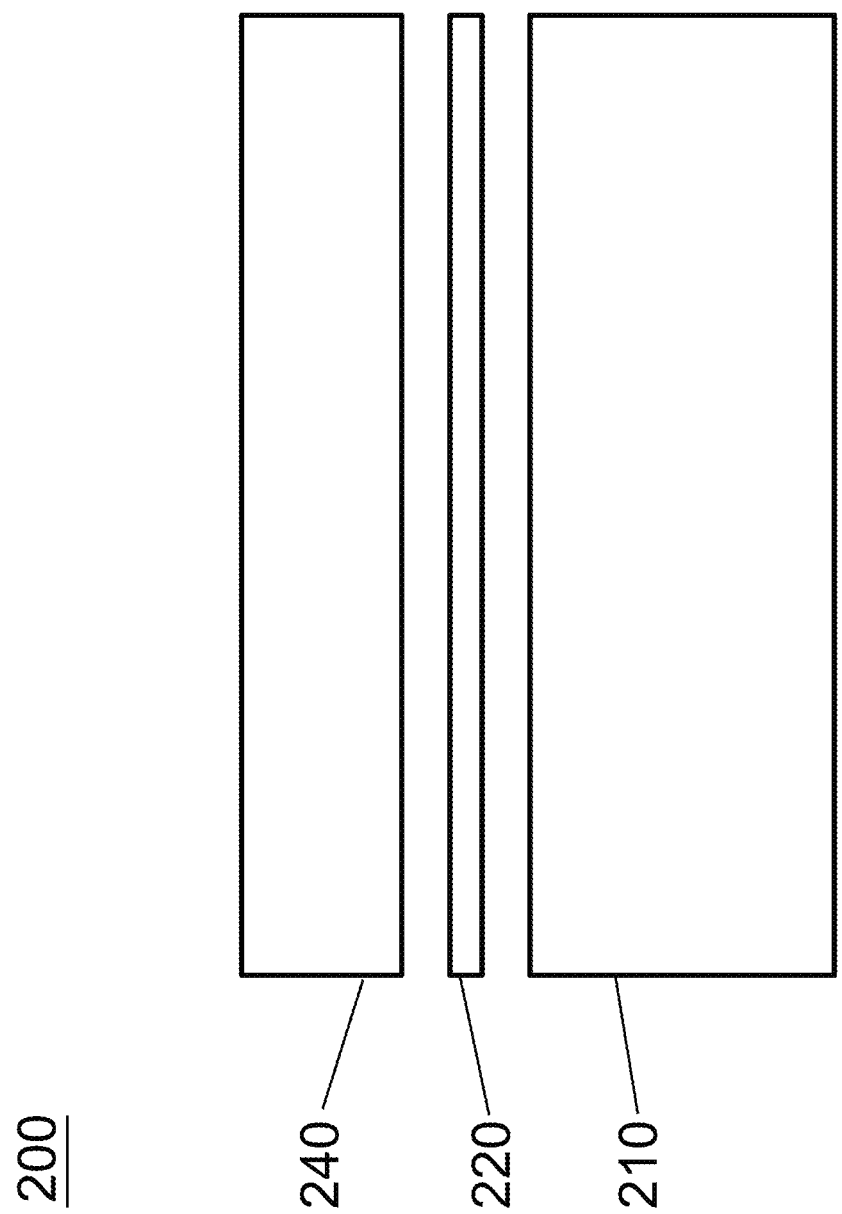
FIG. 2 is a schematic exploded cross-section of a circuit substrate formed from a first metal layer, a bonding layer, and a ceramic layer. Here, the bonding layer is an adhesive containing thermally conductive particles.

FIG. 2 is an exploded cross-sectional view of a metal-on-ceramic substrate 200 of the present disclosure. This circuit substrate is formed from a ceramic layer 210, a first metal layer 240 that is to be joined to one side of the ceramic layer, and a bonding layer 220 located between the ceramic layer 210 and the first metal layer 240. Pressure is applied to join the three layers together, and the substrate is then exposed to high temperature to cause curing of the bonding layer. The bonding layer 220 includes a thermally conductive adhesive. In particular embodiments, curing is performed by applying a pressure from about 65 kPa to about 75 kPa and a temperature from about 210° C. to about 290° C. Curing can be performed in air, dry nitrogen or vacuum.

The ceramic layer 210 can be a ceramic selected from the group consisting of aluminum nitride, alumina, beryllium oxide, zirconia toughened alumina, silicon carbide, or silicon nitride. The ceramic layer can have a thickness of about 20 mils to about 60 mils. In particularly desired embodiments, the ceramic layer is aluminum nitride (AlN). The ceramic layer generally has high thermal conductivity, and is used to transport heat generated within the metal layer away from the metal layer and towards a heatsink.

The metal that forms the first metal layer 240 can be chosen from copper, covetic copper, copper-beryllium, aluminum, aluminum-silicon-carbide (AlSiC), silver, gold, palladium, platinum, nickel, gold, stainless steel, nickel-cobalt ferrous alloy, and alloys thereof. The metal layer can have a thickness of about 1 mil to about 30 mils. In particularly desired embodiments, the first metal layer is made of copper.

In some desirable embodiments, the first metal layer can be formed from a set of sublayers. This may be useful to protect a given sublayer with other sublayers. In such embodiments, there may be a minimum of two sublayers or of three sublayers. For example, a copper sublayer can be plated or clad on one or both faces with another metal sublayer to prevent oxidation of the copper, prior to being bonded to the ceramic layer. As another example, a sheet of copper could be plated on both faces with nickel, then palladium, then gold, and then be bonded to the ceramic layer. In a cross-sectional view, this would form a first metal layer made up of seven total sublayers.

The bonding layer comprises an adhesive that is thermally conductive, i.e. has low thermal resistance. More specifically, the adhesive includes (i) a polyimide or thermoplastic polyimide or a polyimide-and-epoxy blend, mixed with (ii) thermally conductive particles. Most desirably, a thermoplastic polyimide is used. Thermoplastic polyimide provides a fast-acting bond and is suitable for high temperature operations. However, polyimides are thermal insulators and do not conduct heat very well.

The particles are made of a material that is thermally conductive and can be in the form of round grains or flakes. The material can also be a dielectric in some embodiments. Non-limiting examples of such particles include silver, gold, copper, graphene, carbon nanotubes, hexagonal BN, würtzitic BN, cubic BN, BN nanotubes, diamond, AlN and $Si_3N_4$. These thermally conductive particles provide a thermal conduction capability to the polyimide and the overall adhesive. The particles may be present in an amount of from greater than 0 to about 80 volume percent of the adhesive, including from about 10 to about 75 volume percent. Desirably, the adhesive is thermally conductive and is also electrically insulating. A thermally conductive, dielectric bond layer enables the adhesive to remain fully coating the surface of the ceramic after etch definition of the copper layer. The dielectric TPI will be able to stand off voltage between the copper pads. The bonding layer may have a thickness of about 2 micrometers (μm) to about 150 μm, or from about 8 μm to about 125 μm.

The adhesive can be an A-stage adhesive, in which the polyimide is liquid and a relatively significant amount of solvent is still present. However, in more desired embodiments, the adhesive is a B-staged coating on the metal layer and/or the ceramic layer, in which the majority of solvent has been previously removed and the adhesive is uncured, but can be handled and shaped relatively easily.

The resulting metal-on-ceramic substrate can be used for high current (1 to 100 amperes) power devices. The metal layer is electrically conductive, and heat generated therefrom is conducted through the bonding layer to the ceramic layer for conduction to a heatsink. Particular applications include thermoelectric coolers, high power inverter circuits, concentrator photovoltaic modules, high power traction motor circuits, and high current busbars.

The use of a thermoplastic polyimide filled with thermally conductive particles as the adhesive in the bonding layer provides several advantages. First, this adhesive will bond well to most ceramic, metal, or glass surfaces without requiring pre-metallization of that surface. Second, this adhesive can cure at temperatures below 300° C. This reduces residual stress between the ceramic layer and the metal layer that results from the high temperatures needed for direct bond copper (1070° C.) or active metal braze (825° C.) and the subsequent cooling down room temperature. This low temperature cure also reduces processing costs since lower-cost ovens or hot plates can be used instead of expensive high temperature furnaces.

Another advantage is that this adhesive can be operated above its curing temperature without degrading. This permits higher operating temperatures in the final substrate, and also allows the circuits to withstand higher amperage excursions compared to other adhesives. Once cured, the thermoplastic polyimide filled with thermally conductive particles can withstand extended operation in air at 350° C. and thermal excursions to 450° C. By comparison, epoxy adhesives typically cure at a low temperature of around 170° C., and will debond, char or delaminate at higher temperatures. A substrate made per the current disclosure is compatible with subsequent die attach using conventional die bonding materials such as silver-filled epoxy, AuSn solder (280° C.), and SnAgCu solder (217° C.).

Yet another advantage that arises is that due to the reduced residual stress, new metal layers can be bonded to the ceramic substrate than were previously possible. For example, an aluminum-clad copper sheet can be used as the metal layer. The metal layer can be of variable thickness and topography/shape. For example, the metal layer could include a terminal post, an LED reflector, holes or slots, heatsink fins, or other features that could be stamped, milled, or photoetched into the metal layer. Put another way, the metal layer can now be shaped into various three-dimensional forms.

For substrates made per the prior art, severe residual stress due to CTE mismatch previously required metal layers to be placed on both sides/faces of the ceramic layer to prevent bowing. In the present disclosure, the thickness of metal layers on opposite sides of the ceramic layer can be significantly different, while the ceramic layer maintains its flatness after the bonding layer/adhesive is cured. Indeed, under many combinations of metal and ceramic, a metal layer only needs to be present on one side of the ceramic layer when the bonding layer of the present disclosure is used. This can be advantageous in certain applications, plus it can reduce cost.

Next, the metal layer can be electroplated or clad prior to bonding. For example, a copper sheet can be electroplated with nickel, palladium, gold, silver or combinations thereof. The copper sheet could be clad with aluminum, stainless steel, or combinations thereof. At the higher processing temperatures of the prior art needed to bond the ceramic to the metal layer, these plated/clad layers would diffuse into the copper and lose their desirable properties. With the reduced bonding temperatures of 300° C. or less of the present disclosure, these sublayers can be maintained.

Figure 3:
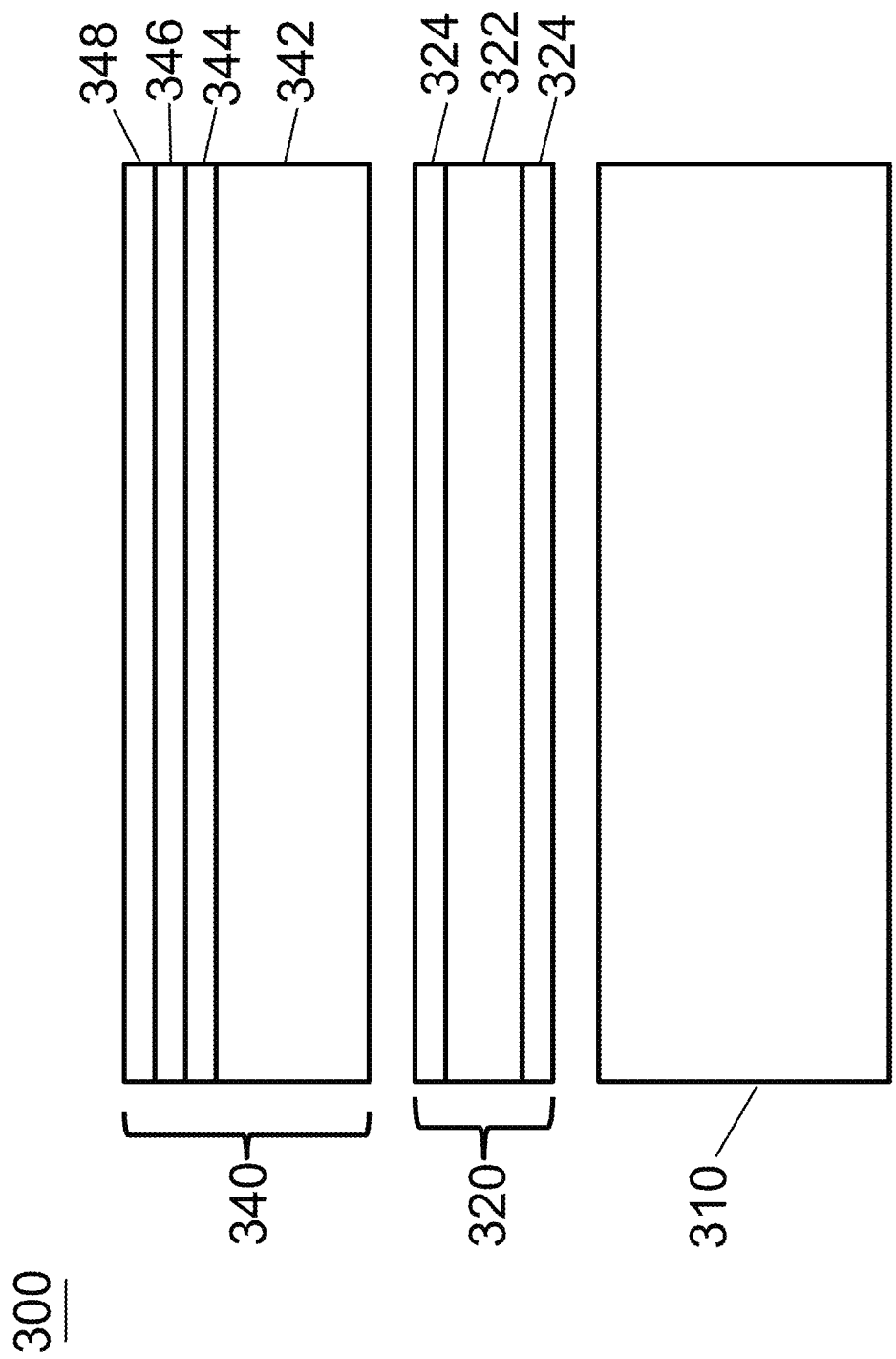
FIG. 3 is a schematic exploded cross-section of a circuit substrate in which the bonding layer comprises a foil layer and two adhesive layers on opposite sides of the foil layer.

FIG. 3 is a cross-sectional view of a second exemplary embodiment of a metal-on-ceramic substrate 300 of the present disclosure, illustrating some variations and differences in the layers that are contemplated by the present disclosure.

This embodiment includes a ceramic layer 310, a bonding layer 320, and a metal layer 340. The bonding layer is comprised of a metal foil 322 and two adhesive layers 324, located on opposite sides of the foil 322. The adhesive layers 324 are formed of (i) a polyimide or thermoplastic polyimide or a polyimide+epoxy blend, mixed with (ii) thermally conductive particles, as described above. The metal layer 340 here is formed from a set of sublayers. A copper sheet is plated with nickel, then palladium, then flash gold, on top of the copper sheet, for a total of four sublayers 342, 344, 346, 348.

Other embodiments of the metal-on-ceramic substrate are also contemplated, though not illustrated. In FIG. 2 and FIG. 3, only a first metal layer is present on one side of the ceramic layer. It is also contemplated that a second metal layer could be placed on the opposite side of the ceramic layer, so that the ceramic layer is between the two metal layers. A bonding layer using the adhesive of the present disclosure (thermoplastic polyimide plus thermally conductive particles) can also be used to bond the second metal layer to the ceramic layer. The first metal layer and the second metal layer can have different thicknesses from each other.

It is noted that the metal layer(s) of the ceramic-on-metal substrate can be processed to obtain a desired shape. This processing can be done prior to bonding the metal layer to the ceramic layer, or can be done after bonding to the ceramic layer. In some embodiments, the first metal layer 240, 340 and the bonding layer 220, 320 may be machined into the desired shape prior to bonding. For example, the bonding layer may be affixed to the metal layer, and the two layers can then be stamped or cut into the desired pattern. Alternatively, the bonding layer and the metal layer can be stamped or cut into the desired pattern separately. A fixture or jig can then be used to align the ceramic layer, the patterned bonding layer, and the patterned metal layer. Pressure is applied to join the three layers together, then the adhesive is cured.

In other embodiments, the substrate is first formed by bonding the layers together and curing the adhesive. Subsequently, the first metal layer and the bonding layer are photoetched to obtain the desired pattern.

In this regard, the thermoplastic polyimide used in the adhesive, once fully cured, will resist etching by acids and bases.

Figure 4:
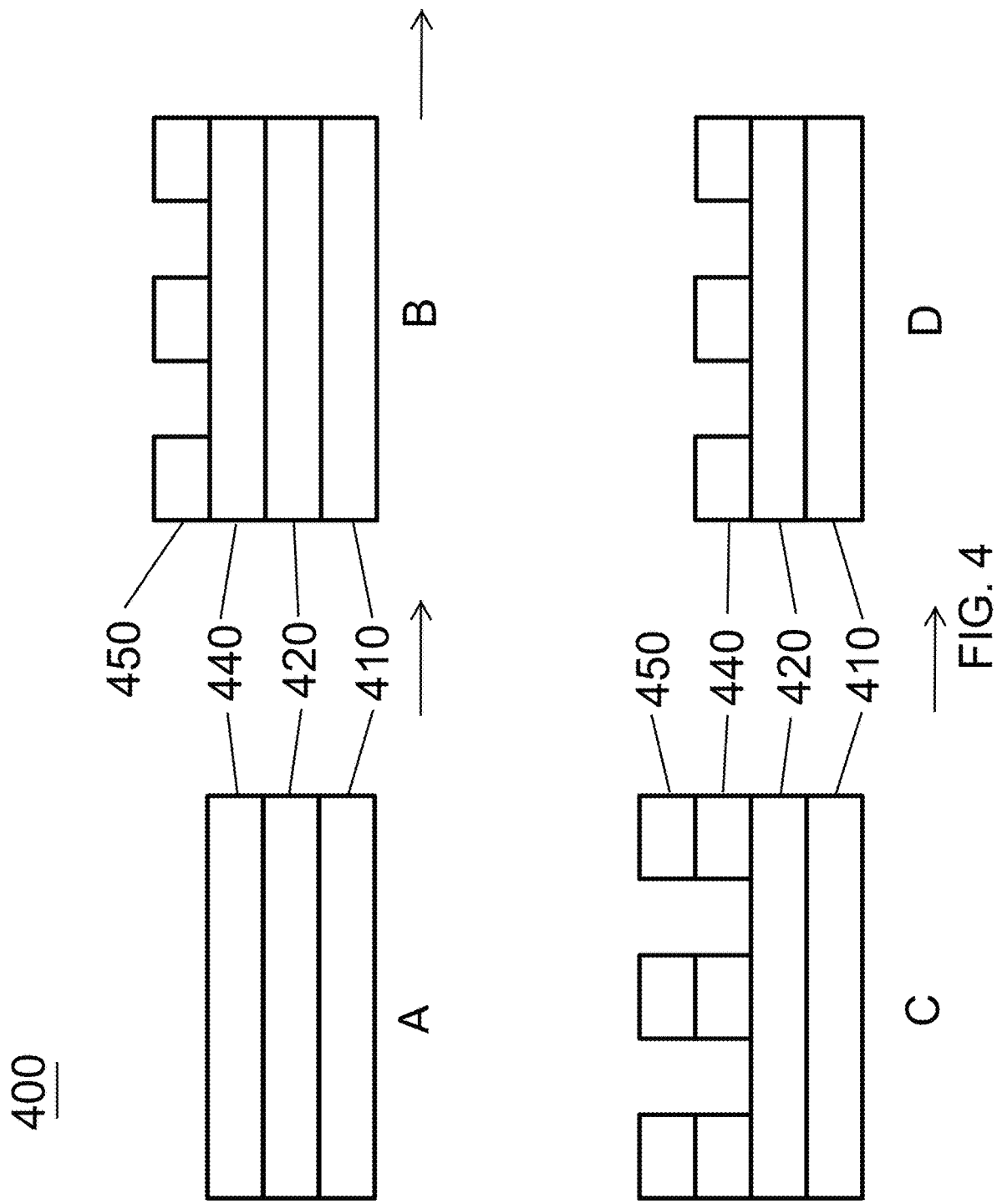
FIG. 4 is an illustration showing the patterning of the circuit substrate using photoresist.

FIG. 4 is an illustration of one method for post-etching the metal layer. The substrate starts at the left (labeled A) with the ceramic layer 410, bonding layer 420, and first metal layer 440 already bonded together. Next, photoresist 450 is applied as a layer upon the first metal layer, and then exposed to obtain the desired pattern (labeled B). Next, acid is used to etch the first metal layer (labeled C). Suitable acids that etch copper include ferric chloride and cupric chloride. Next, an alkaline solution is used to strip the developed photoresist (labeled D).

Figure 5:
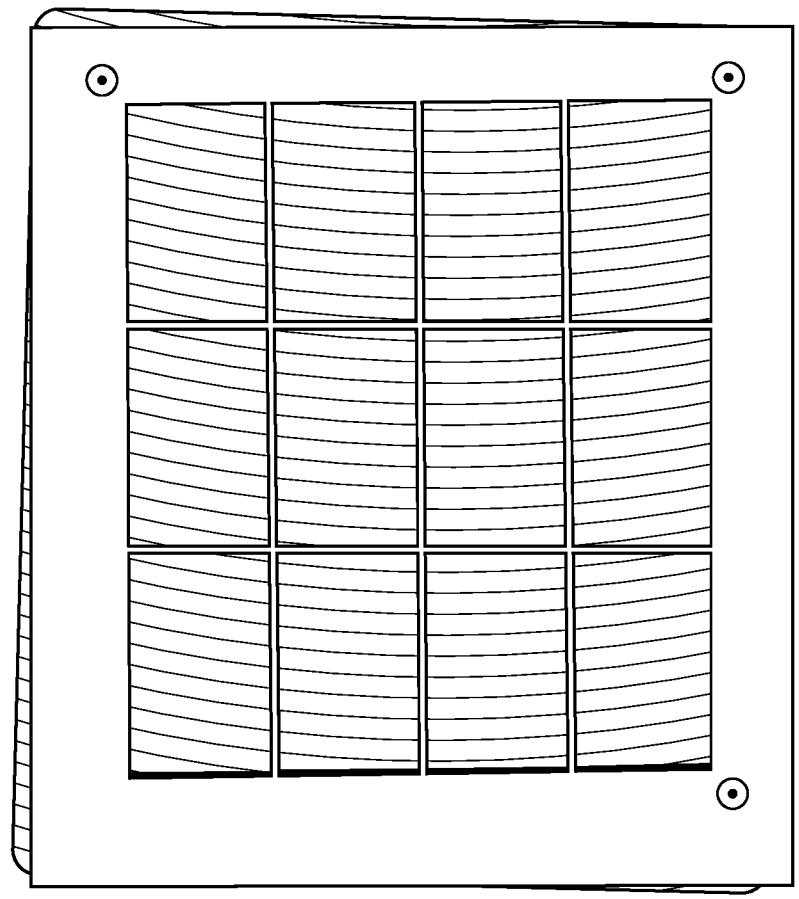
FIG. 5 is a photo of photoetched copper on a AlN substrate. The adhesive is diamond-filled TPI which remains as a coating over the entire top surface of the AlN, including the gaps between the Cu pads.

FIG. 5 is a photo of a substrate fabricated according to embodiments of the present disclosure. A metal layer of 10 mil thick Cu was bonded to an AlN substrate using TPI filled with diamond powder. The Cu was photoetched to define isolated pads. None of the chemicals used for photoetching corroded the TPI bonding layer. The diamond-filled TPI bonding layer is a thermally conductive dielectric that provides good electrical isolation between the Cu pads.

The following examples are provided to illustrate the substrates and processes of the present disclosure. The examples are merely illustrative and are not intended to limit the disclosure to the materials, conditions, or process parameters set forth therein.

EXAMPLES

Example 1

A copper sheet is provided that has dimensions of 5 inches×7 inches×0.012 inches thickness. The 0.012" thick copper sheet is coated on one face with an A-stage adhesive formed from thermoplastic polyimide (TPI) that is filled with diamond particles having a diameter of 1-2 microns. Spin coating is used to deposit a layer of A-staged, diamond-filled TPI uniformly over the area of the copper sheet. The TPI layer is then B-staged to a thickness of 3-5 μm. Next, an unmetallized sheet of aluminum nitride of dimensions 5 inches×7 inches×0.020 inches thickness is positioned beneath the TPI-coated copper sheet. The copper and bonding layer are both aligned with the ceramic substrate. A pressure of about 10 psi (69 kPa) is applied and the TPI is cured at 280° C. in a vacuum oven.

The copper face is then coated with photoresist, the photoresist is patterned, and the copper is etched in an acid such as ferric chloride. The developed photoresist is then stripped in an alkaline solution so as to remove all of the developed photoresist. The alkaline solution is rinsed away. The copper is then thoroughly cleaned of residual resist and is then plated with nickel, palladium, and flash gold.

Example 2

A copper sheet of dimensions 5 inches×7 inches×0.012 inches thickness is photoetched to the desired shape. The copper sheet is then electroplated with nickel, palladium, and flash gold on all surfaces (i.e. the copper sheet is a sublayer encased or encapsulated with other metal sublayers). A bonding layer is made of 3 μm of silver-filled, B-staged thermoplastic polyimide on both sides of a 25 μm foil made of silver. The bonding layer is then stamped into the same dimensions and shape as the photoetched copper. Then, an unmetalized sheet of aluminum nitride of dimensions 5 inches×7 inches×0.020 inches is positioned beneath the bonding layer and the copper sheet. The copper sheet and bonding layer are both aligned atop the aluminum nitride sheet using a fixture or jig. A pressure of about 10 psi (69 kPa) is applied to join the three layers together, and the bond film is cured at 280° C. to obtain the finished substrate.

Example 3

A copper sheet is provided that has dimensions of 5 inches×7 inches×0.012 inches thickness. The copper sheet is coated on one face with an A-stage adhesive formed from thermoplastic polyimide (TPI) that is filled with silver flakes. The TPI layer is then B-staged to a thickness of 3 μm. The sheet is then formed to the desired shape by machining, wire EDM, waterjet cutting, or stamping in such a way as to not harm the TPI layers bonded to the copper. Next, an unmetallized sheet of aluminum nitride of dimensions 5 inches×7 inches×0.020 inches thickness is positioned beneath the TPI-coated copper sheet. The copper and bonding layer are both aligned with the ceramic substrate. A pressure of about 10 psi (69 kPa) is applied and the TPI is cured at 280° C.

The copper is then thoroughly cleaned in solutions and is then plated with nickel, palladium, and flash gold.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:
1. A circuit substrate comprising:
 a ceramic layer;
 a first metal layer; and
 a bonding layer joining the first metal layer to the ceramic layer, the bonding layer comprising an adhesive which is thermally conductive; and
 a second metal layer on a side of the ceramic layer opposite the first metal layer;
 wherein the adhesive of the bonding layer consists of (i) a thermoplastic polyimide, and (ii) thermally conductive particles; and wherein the thermally conductive particles are selected from the group consisting of silver, copper, gold, diamond, and $Si_3N_4$.

2. The circuit substrate of claim 1, wherein the bonding layer comprises a foil layer and two adhesive layers on opposite sides of the foil layer.

3. The circuit substrate of claim 1, wherein the thermally conductive particles are selected from the group consisting of silver, copper, and gold.

4. The circuit substrate of claim 1, wherein the first metal layer is a metal selected from the group consisting of copper, covetic copper, copper-beryllium, aluminum, aluminum silicon carbide (AlSiC), silver, palladium, platinum, nickel, gold, stainless steel, nickel-cobalt ferrous alloy, and alloys thereof.

5. The circuit substrate of claim 4, wherein the first metal layer includes a set of sublayers.

6. The circuit substrate of claim 1, wherein the first metal layer has a thickness of from about 1 mil to about 30 mils.

7. The circuit substrate of claim 1, wherein the ceramic layer is made of a ceramic selected from the group consisting of aluminum nitride, alumina, BeO, zirconia toughened alumina (ZTA), SiC, and $Si_3N_4$.

8. The circuit substrate of claim 1, wherein the ceramic layer has a thickness of about 20 mils to about 60 mils.

9. The circuit substrate of claim 1, wherein the thermally conductive particles are round or flake.

10. A circuit substrate comprising:
a ceramic layer;
a first metal layer; and
a bonding layer joining the first metal layer to the ceramic layer, the bonding layer comprising an adhesive which is thermally conductive; and
a second metal layer on a side of the ceramic layer opposite the first metal layer;
wherein the adhesive of the bonding layer consists of (i) a thermoplastic polyimide, and (ii) thermally conductive particles, and wherein the bonding layer is cured at a temperature from 210° C. to 290° C.

11. The circuit substrate of claim 10, wherein the bonding layer is thermally stable up to 350° C. in air.

12. The circuit substrate of claim 10, wherein the bonding layer is cured at a pressure from 65 kPa to 75 kPa, and wherein the bonding layer is cured in air, dry nitrogen, or vacuum.

13. The circuit substrate of claim 10, wherein the thermally conductive particles are selected from the group consisting of silver, copper, gold, graphene, carbon nanotubes, diamond, boron nitride (BN), aluminum nitride (AlN), and silicon nitride ($Si_3N_4$).

14. The circuit substrate of claim 10, wherein the thermally conductive particles are selected from the group consisting of silver, copper, gold, diamond, and $Si_3N_4$.

15. The circuit substrate of claim 10, wherein the first metal layer is a metal selected from the group consisting of copper, covetic copper, copper-beryllium, aluminum, aluminum silicon carbide (AlSiC), silver, palladium, platinum, nickel, gold, stainless steel, nickel-cobalt ferrous alloy, and alloys thereof.

16. The circuit substrate of claim 10, wherein the ceramic layer is made of a ceramic selected from the group consisting of aluminum nitride, alumina, BeO, zirconia toughened alumina (ZTA), SiC, and $Si_3N_4$.

17. The circuit substrate of claim 10, wherein the bonding layer comprises a foil layer and two adhesive layers on opposite sides of the foil layer.

18. The circuit substrate of claim 17, wherein the foil layer is silver and the first metal layer is a metal selected from the group consisting of copper, covetic copper, copper-beryllium, aluminum, aluminum silicon carbide (AlSiC), palladium, platinum, nickel, gold, stainless steel, nickel-cobalt ferrous alloy, and alloys thereof.

19. The circuit substrate of claim 10, wherein the bonding layer has a thickness of from about 2 μm to about 150 μm.

20. The circuit substrate of claim 19, wherein the bonding layer has a thickness of from about 8 μm to about 125 μm.

* * * * *